(12) United States Patent
Hong

(10) Patent No.: US 7,182,996 B2
(45) Date of Patent: Feb. 27, 2007

(54) DEPOSITING NANOWIRES ON A SUBSTRATE

(75) Inventor: Seunghun Hong, Seoul (KR)

(73) Assignee: Florida State University Research Foundation, Inc., Tallahassee, FL (US)

( * ) Notice: Subject to any disclaimer, the term of this patent is extended or adjusted under 35 U.S.C. 154(b) by 337 days.

(21) Appl. No.: 10/718,999

(22) Filed: Nov. 21, 2003

(65) Prior Publication Data

US 2004/0166233 A1 Aug. 26, 2004

Related U.S. Application Data

(60) Provisional application No. 60/499,216, filed on Aug. 28, 2003, provisional application No. 60/428,629, filed on Nov. 22, 2002.

(51) Int. Cl.
*B32B 3/00* (2006.01)
*B32B 15/08* (2006.01)

(52) U.S. Cl. .................... 428/209; 428/210; 428/297.7; 428/298.1; 428/432; 428/433; 428/458

(58) Field of Classification Search ................ 428/209, 428/195, 458, 297.7, 298.1, 210, 432–433
See application file for complete search history.

(56) References Cited

U.S. PATENT DOCUMENTS

| | | | |
|---|---|---|---|
| 6,248,674 B1 | 6/2001 | Kamins et al. | |
| 6,270,946 B1 | 8/2001 | Miller | |
| 6,458,621 B1 | 10/2002 | Beck | |
| 6,522,446 B2 * | 2/2003 | Saxe | 359/237 |
| 6,893,966 B2 * | 5/2005 | Delamarche et al. | 438/689 |

FOREIGN PATENT DOCUMENTS

WO    WO 00/41213 A1    7/2000

OTHER PUBLICATIONS

Jaschke M., Deposition of Organic Material by then Tip of a Scanning Force Microscope Langmuir, 1995, vol. 11, pp. 1061-1064.
Hong, S. and Mirkin, C.A., "A Nanoplotter with both Parallel and Serial Writing Capabilities," Science 288, 1808-1811 (2000) p. 2 RH Column Teaches 16-Mercaptohexaclecanoic acid.
Demers, L.M., et al., Direct Patterning of Modified Oligonucleotides on Metals and Insulators by Dip-pen nanolithography,: Science 296, 1836-1838 (2002).
Xia, Y. and Whitesides, G.M., Use of Controlled Reactive Spreading of Liquid Alkanethiol on the Surface of Gold to Modify the Size of Features Produced by Microcontact Printing,: J. Am. Chem. Soc. 117, 3274-3275 (1995).

* cited by examiner

*Primary Examiner*—Cathy F. Lam
(74) *Attorney, Agent, or Firm*—Cooley Godward Kronish LLP

(57) ABSTRACT

Processes for depositing nanowires on a substrate and nanowire-based devices that can be formed using these processes are described. In one embodiment, a process includes forming an organic layer on an electrically conductive layer formed on the substrate. The organic layer includes a first region and a second region. The first region has an affinity for the nanowires and is electrically conductive. The process also includes contacting the organic layer with a composition including the nanowires dispersed in a compatible solvent for a time sufficient to selectively deposit at least one of the nanowires on the first region of the organic layer.

15 Claims, 8 Drawing Sheets

US 7,182,996 B2

DEPOSITING NANOWIRES ON A SUBSTRATE

CROSS-REFERENCE TO RELATED APPLICATIONS

This application claims the benefit of U.S. Provisional Application No. 60/428,629, filed on Nov. 22, 2002, and U.S. Provisional Application No. 60/499,216, filed on Aug. 28, 2003, the disclosures of which are incorporated herein by reference in their entireties.

STATEMENT REGARDING FEDERALLY SPONSORED RESEARCH OR DEVELOPMENT

The work leading to the invention was funded in part by grant no. NAG-1-02022 from the National Aeronautics and Space Administration.

FIELD OF THE INVENTION

The invention relates generally to nanowires. In particular, processes for depositing nanowires on a substrate and nanowire-based devices that can be formed using these processes are described.

BACKGROUND OF THE INVENTION

As the miniaturization of microelectronic circuits approaches technical and economical limits, extensive efforts have been made to develop devices based on nanowires such as, for example, carbon nanotubes. Nanowires are typically synthesized in a solution or a powder form. To build devices from nanowires, the nanowires often have to be deposited on a substrate with particular positions and orientations.

Existing assembly processes for depositing nanowires sometimes require direct manipulation of the nanowires via nano-manipulators or alignment of the nanowires via an external force, such as, for example, using a flow cell or an applied electric field. Assembly processes requiring use of nano-manipulators are slow processes and are generally not suitable for industrial applications. Assembly processes requiring use of an external force can be used to deposit nanowires on a substrate with a particular orientation. However, requiring use of an external force adds an additional processing operation, which increases assembly time and costs. Moreover, it can be difficult and time-consuming to deposit nanowires with different orientations on the same substrate using an external force.

It is against this background that a need arose to develop the processes and nanowire-based devices described herein.

SUMMARY OF THE INVENTION

One aspect of the invention relates to a process of depositing nanowires on an electrically conductive layer formed on a substrate. In one embodiment, the process includes forming an organic layer on the electrically conductive layer. The organic layer includes a first region and a second region. The first region has an affinity for the nanowires and is electrically conductive. The process also includes contacting the organic layer with a composition including the nanowires dispersed in a compatible solvent for a time sufficient to selectively deposit at least one of the nanowires on the first region of the organic layer.

In another embodiment, the process includes forming a patterned layer on the electrically conductive layer. The patterned layer includes a first region and a second region. The first region of the patterned layer has an affinity for the nanowires and is electrically conductive, and the second region of the patterned layer substantially lacks an affinity for the nanowires. The process also includes contacting the patterned layer with a composition including the nanowires dispersed in a compatible solvent for a time sufficient to selectively deposit at least one of the nanowires on the first region of the patterned layer.

Another aspect of the invention relates to a process of depositing nanowires on a substrate. In one embodiment, the process includes forming a pair of electrical contacts on the substrate. The pair of electrical contacts are spaced apart from one another. The process also includes depositing a first plurality of organic molecules on the pair of electrical contacts. The first plurality of organic molecules have an affinity for the nanowires and are electrically conductive. The process also includes depositing a second plurality of organic molecules on the substrate between the pair of electrical contacts. The second plurality of organic molecules substantially lack an affinity for the nanowires. The process further includes contacting the pair of electrical contacts including the first plurality of organic molecules deposited thereon with a composition including the nanowires dispersed in a compatible solvent for a time sufficient so that at least one of the nanowires is deposited to electrically couple the pair of electrical contacts.

In another embodiment, the process includes depositing a first plurality of organic molecules on the substrate to form a plurality of domains that are spaced apart from one another. Each of the first plurality of organic molecules includes a plurality of conjugated π-bonds and an exposed polar group. The process also includes providing a compositing including the nanowires dispersed in a compatible solvent and contacting the substrate including the first plurality of organic molecules deposited thereon with the composition for a time sufficient so that each of the plurality of domains includes at least one of the nanowires deposited thereon.

In a further embodiment, the process includes depositing a plurality of organic molecules on an area of the substrate. Each of the plurality of organic molecules includes an exposed non-polar group. The process also includes providing a composition including the nanowires dispersed in a halogenated organic solvent and contacting the substrate including the plurality of organic molecules deposited thereon with the composition for a time sufficient to selectively deposit at least one of the nanowires on a remaining area of the substrate not having the plurality of organic molecules deposited thereon.

Another aspect of the invention relates to a nanowire-based device. In one embodiment, the nanowire-based device includes an electrically conductive layer and an organic layer positioned on the electrically conductive layer. The organic layer is formed of a plurality of organic molecules each including a plurality of conjugated π-bonds. The nanowire-based device also includes a nanowire positioned on the organic layer.

In another embodiment, the nanowire-based device includes a substrate and a pair of electrical contacts formed on the substrate. The pair of electrical contacts are spaced apart from one another. The nanowire-based device also includes a first plurality of organic molecules deposited on the pair of electrical contacts. The first plurality of organic molecules are electrically conductive and each includes a polar group. The nanowire-based device further includes a first nanowire deposited on the first plurality of organic molecules to electrically couple the pair of electrical contacts.

Other aspects and embodiments of the invention are also contemplated. The foregoing summary and the following detailed description are not meant to restrict the invention disclosed herein to any particular embodiment but are merely meant to describe some embodiments of the invention.

BRIEF DESCRIPTION OF THE DRAWINGS

For a better understanding of the nature and objects of various embodiments of the invention, reference should be made to the following detailed description taken in conjunction with the accompanying drawings.

DETAILED DESCRIPTION

Embodiments of the invention relate to processes for depositing nanowires on a substrate and nanowire-based devices that can be formed using these processes. A nanowire typically refers to an elongated structure that can be used to transport an electrical current. A nanowire can have a length in the range of about 2 microns to about 40 microns, such as, for example, in the range of about 3 microns to about 10 microns, and a cross-sectional diameter or width in the range of about 1 nanometer to about 1000 nanometers, such as, for example, in the range of about 1 nanometer to about 200 nanometers. Since the length of a nanowire can be in the micron range, the nanowire can sometimes be referred to as a microwire. A nanowire can be formed from any material useful for transporting an electrical current. Examples of nanowires include single-wall carbon nanotubes ("SWCNTs") having cross-sectional diameters in the range of about 1 nanometer to about 2 nanometers, multi-wall carbon nanotubes having cross-sectional diameters in the range of about 10 nanometers to about 15 nanometers, silicon nanowires, metallic nanowires formed from gold or nickel and having cross-sectional diameters of about 100 nanometers, and metal oxide nanowires having rectangular cross-sections of about 10 nanometers by about 100 nanometers. Other materials useful for forming nanowires include semiconductor materials, such as, for example, zinc selenide, cadmium sulfide, and other Group II–VI semiconductor materials.

One aspect of the invention relates to a process for depositing nanowires on a substrate. In one embodiment, such a process includes forming a patterned layer on the substrate. The patterned layer includes a first region and a second region. The first region of the patterned layer has an affinity for the nanowires, while the second region of the patterned layer substantially lacks an affinity for the nanowires. The process also includes contacting the patterned layer with a composition including the nanowires dispersed in a compatible solvent for a time sufficient to selectively deposit at least one of the nanowires on the first region of the patterned layer.

Figure 1:
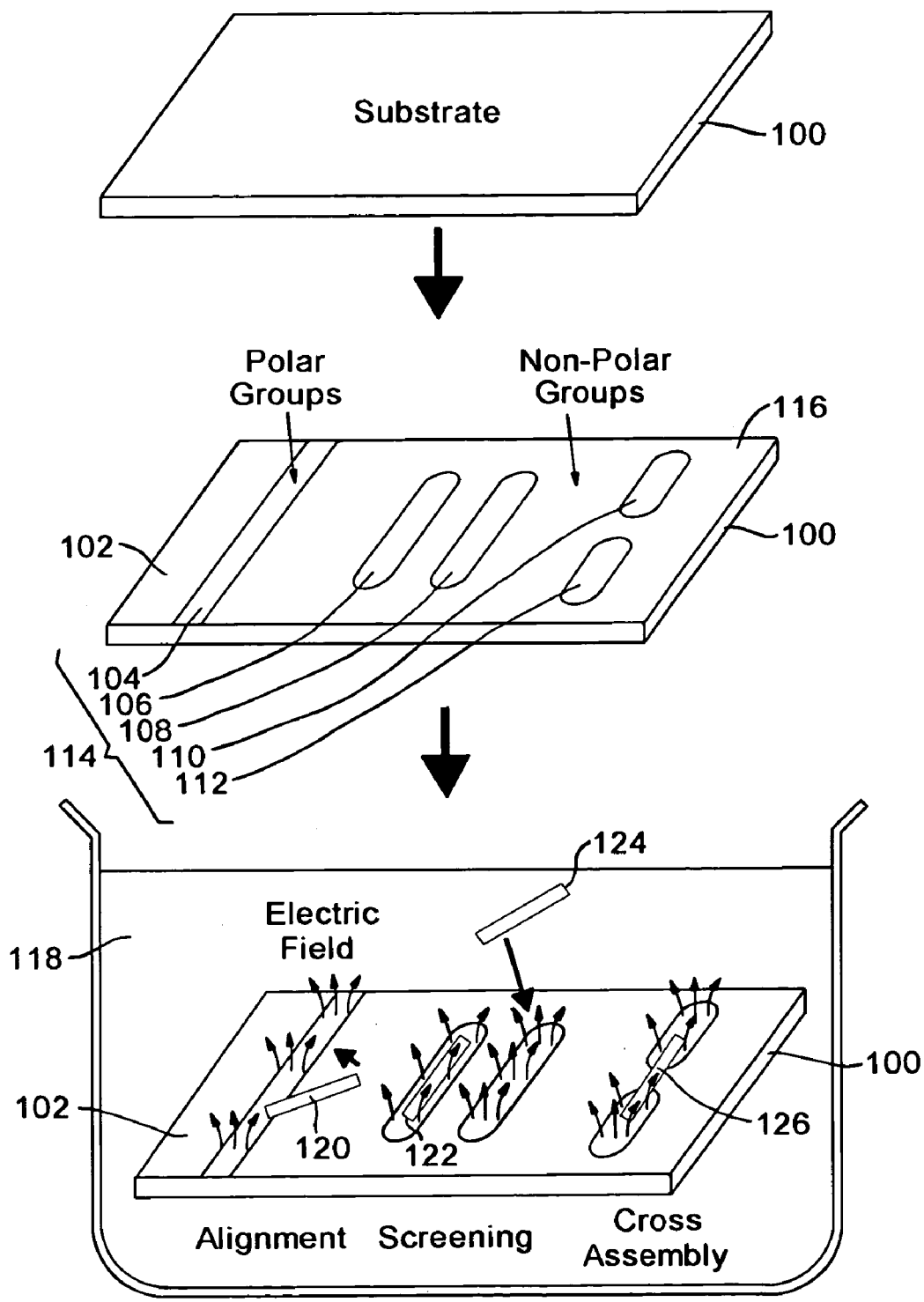
FIG. 1 illustrates a process for depositing nanowires on a substrate, according to an embodiment of the invention.

FIG. 1 illustrates a process for depositing nanowires 120, 122, 124, and 126 on a substrate 100, according to such an embodiment of the invention. The process can be used to deposit the nanowires 120, 122, 124, and 126 on the substrate 100 with desired positions and orientations and can be used for mass production of nanowire-based devices, such as, for example, circuit elements, radiation detectors, thermophotovoltaic devices, biological sensors, and chemical sensors.

As illustrated in FIG. 1, the substrate 100 can be, for example, a Si substrate or a $SiO_2$ substrate, and a patterned layer is formed on the substrate 100 to facilitate deposition of the nanowires 120, 122, 124, and 126. In some instances, the substrate 100 can include an electrically conductive layer formed thereon, and at least a portion of the patterned layer can be formed on the electrically conductive layer. In the illustrated embodiment, the patterned layer is an organic layer 102 that includes a first region 114 and a second region 116. The first region 114 of the organic layer 102 has an affinity for the nanowires 120, 122, 124, and 126, while the second region 116 of the organic layer 102 substantially lacks an affinity for the nanowires 120, 122, 124, and 126. While the organic layer 102 is illustrated including both the first region 114 and the second region 116, it is contemplated that the organic layer 102 can simply include one of the first region 114 and the second region 116 for certain applications. Once the organic layer 102 is formed, the organic layer 102 is contacted with a composition 118 of the nanowires 120, 122, 124, and 126 for a time sufficient to selectively deposit the nanowires 120, 122, 124, and 126 on the first region 114 of the organic layer 102.

As discussed previously, the organic layer 102 includes the first region 114 that has an affinity for the nanowires 120, 122, 124, and 126. In the illustrated embodiment, the first region 114 of the organic layer 102 includes a number of spaced-part domains 104, 106, 108, 110, and 112 each having an affinity for the nanowires 120, 122, 124, and 126. This affinity typically refers to an attractive interaction between the domains 104, 106, 108, 110, and 112 and the nanowires 120, 122, 124, and 126, such as, for example, an electrostatic affinity or a covalent affinity for the nanowires 120, 122, and 126. For certain applications, this affinity is desirably an electrostatic affinity, since its relatively long-range effect facilitates deposition of the nanowires 120, 122, 124, and 126 on the domains 104, 106, 108, 110, and 112 with increased speed and precision and without requiring use of an external force. Because of the affinity of the domains 104, 106, 108, 110, and 112 for the nanowires 120, 122, 124, and 126, the nanowires 120, 122, 124, and 126 are attracted towards the domains 104, 106, 108, 110, and 112 and are bound to the domains 104, 106, 108, 110, and 112. In instances where the organic layer 102 is formed on an electrically conductive layer, the domains 104, 106, 108, 110, and 112 can be electrically conductive to enhance electrical coupling with the nanowires 120, 122, 124, and 126 deposited thereon.

The positions and orientations of the nanowires 120, 122, 124, and 126 deposited on the substrate 100 can be controlled by selecting the shapes and sizes of the domains 104, 106, 108, 110, and 112. For example, a domain (e.g., the domain 104) can be elongated and can have a longitudinal dimension sufficiently larger than the lengths of nanowires, so that multiple nanowires can be deposited on the domain in a serial manner, a parallel manner, or an intertwined manner. As another example, a domain (e.g., the domain 106 or 108) can be elongated and can have a longitudinal dimension that is about the same or slightly larger than the lengths of nanowires, so that one or more nanowires can be deposited on the domain. In particular, if the longitudinal dimension of the domain is slightly larger than the lengths of the nanowires, a single nanowire can be deposited near the center of the domain and can be substantially aligned with the longitudinal dimension of the domain. In this example, the domain is typically sufficiently spaced apart from a neighboring domain to prevent the nanowire from being deposited so as to bridge the two domains. As a further example, domains (e.g., the domains 110 and 112) can be formed on electrical contacts, so that one or more nanowires can be deposited to electrically couple the electrical contacts, thus allowing the nanowires to act as conduits for an electric current. In particular, if the longitudinal dimensions of the domains are sufficiently smaller than the lengths of nanowires, one or more nanowires can be deposited to bridge the domains. In this example, the spacing between the domains is typically smaller than the lengths of the nanowires to allow one or more nanowires to bridge the domains. As yet a further example, domains can be elongated and can have longitudinal dimensions with different orientations, so that multiple nanowires can be deposited on the domains with the different orientations.

As illustrated in FIG. 1, the organic layer 102 also includes the second region 116 that substantially lacks an affinity for the nanowires 120, 122, 124, and 126. This lack of affinity typically refers to a repulsive interaction or a lack of an attractive interaction between the second region 116 of the organic layer 102 and the nanowires 120, 122, 124, and 126. As illustrated in FIG. 1, the second region 116 of the organic layer 102 surrounds the domains 104, 106, 108, 110, and 112 and facilitates deposition of the nanowires 120, 122, 124, and 126 on the domains 104, 106, 108, 110, and 112 by substantially blocking deposition of the nanowires 120, 122, 124, and 126 on the second region 116 of the organic layer 102.

In the illustrated embodiment, the first region 114 of the organic layer 102 is formed by depositing a first set of organic molecules on the substrate 100, while the second region 116 of the organic layer 102 is formed by depositing a second set of organic molecules on the substrate 100. Each of the first set of organic molecules can include a polar group having an affinity for the nanowires 120, 122, 124, and 126, and the first set of organic molecules can be deposited so that their polar groups are exposed. In some instances, the polar groups can have an electrostatic affinity for the nanowires 120, 122, 124, and 126 and can each exhibit a substantially stable dipole moment or electrical charge. Examples of polar groups include groups having atoms with relatively high electronegativities, such as, for example, a nitrogen atom and an oxygen atom. For example, the polar groups can be an amino group (i.e., —$NH_2$/—$NH_3^+$) such as, for example, included in cysteamine, 2-mercaptoimidazole, 4-mercaptopyridine, imidazole, mercaptobenzimidazole, and cystine. As another example, the polar groups can be a carboxyl group (i.e., —COOH/—$COO^-$) or a hydroxyl group (i.e., —OH/—$O^-$), such as, for example, included in 16-mercaptohexadecanoic acid and 6-mercaptohexanol, respectively. Each of the first set of organic molecules can also include an anchoring group having an affinity for the substrate 100 (or an electrically conductive layer formed thereon). In some instances, the anchoring groups allow the first set of organic molecules to be bound to the substrate 100 and to form a self-assembled monolayer on the substrate 100. Examples of anchoring groups include groups having a sulfur atom, such as, for example, a thio group (i.e., —SH).

In some instances, the first set of organic molecules can be deposited on an electrically conductive layer, and each of the first set of organic molecules can also include a set of conjugated π-bonds to provide electrical conductivity and to enhance electrical coupling with a nanowire deposited thereon. A conjugated π-bond typically refers to a π-bond that has a π-orbital overlapping (e.g., substantially overlapping) a π-orbital of an adjacent π-bond. Examples of organic molecules including conjugated π-bonds include arenes (e.g., heteroarenes substituted with polar groups, anchoring groups, or both), alkenes (e.g., alkenes substituted with polar groups, anchoring groups, or both), and alkynes (e.g., alkynes substituted with polar groups, anchoring groups, or both). An arene typically refers to an aromatic hydrocarbon molecule that can include from 5 to 100 carbon atoms, such as, for example, from 5 to 20 carbon atoms, and a heteroarene typically refers to an arene that has one or more of its carbon atoms replaced by one or more heteroatoms, such as, for example, a nitrogen atom, a silicon atom, a sulfur atom, an oxygen atom, and a phosphorus atom. An alkene typically refers to an unsaturated hydrocarbon molecule that can include one or more carbon-carbon double bonds and from 2 to 100 carbon atoms, such as, for example, from 2 to 20 carbon atoms. An alkyne typically refers to an unsaturated hydrocarbon molecule that can include one or more carbon-carbon triple bonds and from 2 to 100 carbon atoms, such as, for example, from 2 to 20 carbon atoms. An alkyne can also include one or more carbon-carbon double bonds. In some instances, each of the first set of organic molecules can have a relatively short length to provide electrical conductivity and to enhance electrical coupling with a nanowire deposited thereon. In such instances, the relatively short lengths of the first set of organic molecules can provide sufficient electrical conductivity, such that the first set of organic molecules need not include conjugated π-bonds. For example, each of the first set of organic molecules can have a length that is less than about 2 nanometers or less than about 1.5 nanometers. For certain applications, a resistance of an individual organic molecule included in the first set of organic molecules is less than about 100 mega-ohms, such as, for example, in the range of about 10 kilo-ohms to about 100 mega-ohms.

Table 1 below and Appendices A and B provide examples of organic molecules that can be included in the first set of organic molecules.

TABLE 1

| Organic Molecule | Molecular Structure | Polar Group(s) |
|---|---|---|
| 16-mercaptohexadecanoic acid | $HS(CH_2)_{15}COOH$ | carboxyl group |
| 4-mercaptopyridine | SH-pyridine | nitrogen atom in aromatic Ring |
| cysteamine | $HS(CH_2)_2NH_2$ | amino group |
| 6-mercaptohexanol | $HS(CH_2)_6OH$ | hydroxyl group |
| 2-mercaptoimidazole | imidazole-SH | nitrogen atoms in aromatic ring |
| 2-mercaptopyrimidine | pyrimidine-SH | nitrogen atoms in aromatic ring |

Each of the second set of organic molecules can include a non-polar group substantially lacking an affinity for the nanowires 120, 122, 124, and 126, and the second set of organic molecules can be deposited so that their non-polar groups are exposed. In some instances, the non-polar groups can lack a substantially stable dipole moment or electrical charge. Examples of non-polar groups include groups having atoms with relatively low electronegativities, such as, for example, a carbon atom. For example, the non-polar groups can be an alkyl group (e.g., a methyl group or —$CH_3$), such as, for example, included in 1-octadecanethiol. As with the first set of organic molecules, each of the second set of organic molecules can include an anchoring group having an affinity for the substrate 100 (or an electrically conductive layer formed thereon). In some instances, the anchoring groups allow the second set of organic molecules to be bound to the substrate 100 and to form a self-assembled monolayer on the substrate 100. Appendices A and B provide examples of organic molecules that can be included in the second set of organic molecules.

The first set of organic molecules and the second set of organic molecules can be deposited sequentially or in parallel via a number of deposition techniques, such as, for example, dip-pen nanolithography, microcontact printing, photolithography, and electron-beam lithography. Dip-pen nanolithography typically uses an atomic force microscope tip to deposit organic molecules on a substrate and can be performed as, for example, described in Hong, S. & Mirkin, C. A., "A Nanoplotter with both Parallel and Serial Writing Capabilities," *Science* 288, 1808–1811 (2000); and Demers, L. M. et al., "Direct Patterning of Modified Oligonucleotides on Metals and Insulators by Dip-pen Nanolithography," *Science* 296, 1836–1838 (2002); the disclosures of which are incorporated herein by reference in their entireties. Microcontact printing typically uses a stamp (e.g., a polymer stamp) to deposit organic molecules on a substrate and can be performed as, for example, described in Xia, Y. & Whitesides, G. M., "Use of Controlled Reactive Spreading of Liquid Alkanethiol on the Surface of Gold to Modify the Size of Features Produced by Microcontact Printing," *J. Am. Chem. Soc.* 117, 3274–3275 (1995), the disclosure of which is incorporated herein by reference in its entirety. For example, the first set of organic molecules can be initially deposited on the substrate 100 via dip-pen nanolithography or microcontact printing to form the domains 104, 106, 108, 110, and 112, and the second set of organic molecules can then be deposited on remaining areas of the substrate 100 to form the second region 116 of the organic layer 102. As another example, the second set of organic molecules can be initially deposited on the substrate 100 via dip-pen nanolithography or microcontact printing to form the second region 116 of the organic layer 102, and the first set of organic molecules can then be deposited on remaining areas of the substrate 100 to form the domains 104, 106, 108, 110, and 112. As a further example, the first set of organic molecules and the second set of organic molecules can be deposited on the substrate 100 substantially in parallel via dip-pen nanolithography or microcontact printing to form the first region 114 and the second region 116 of the organic layer 102.

Deposition of the first set of organic molecules and the second set of organic molecules can also be performed via photolithography, electron-beam lithography, or both. For example, a photoresist layer can be initially formed on the substrate 100, and the photoresist layer can be patterned to form a number of trenches. Next, the first set of organic molecules can be deposited in the trenches to form the domains 104, 106, 108, 110, and 112. The patterned photoresist layer can then be removed while retaining the domains 104, 106, 108, 110, and 112 on the substrate 100, and the second set of organic molecules can be deposited on exposed areas of the substrate 100 to form the second region 116 of the organic layer 102. As another example, a photoresist layer can be initially formed on the substrate 100, and the photoresist layer can be patterned to cover areas of the substrate 100 on which the domains 104, 106, 108, 110, and 112 are to be formed. Next, the second set of organic molecules can be deposited on exposed areas of the substrate 100 to form the second region 116 of the organic layer 102. The patterned photoresist layer can then be removed while retaining the second region 116 of the organic layer 102 on the substrate 100, and the first set of organic molecules can be deposited on exposed areas of the substrate 100 to form the domains 104, 106, 108, 110, and 112. As a further example, the first set of organic molecules can be initially deposited on the substrate 100 to form an organic layer, and the organic layer can be patterned using an electron-beam to form the domains 104, 106, 108, 110, and 112. Next, the second set of organic molecules can be deposited on exposed areas of the substrate 100 to form the second region 116 of the organic layer 102. As a yet further example, the second set of organic molecules can be initially deposited on the substrate 100 to form an organic layer, and the organic layer can be patterned using an electron-beam to form a number of trenches. Next, the first set of organic molecules can be deposited in the trenches to form the domains 104, 106, 108, 110, and 112.

To form the composition 118, a compatible solvent can be used to disperse the nanowires 120, 122, 124, and 126 in the solvent. In some instances, the solvent can be an organic solvent, such as, for example, a halogenated organic solvent. A halogenated organic solvent typically includes organic molecules that are each substituted with one or more halo groups, such as, for example, an arene substituted with one or more halo groups (e.g., an arene substituted with one or more chloro groups). For certain applications, a dihalogenated benzene, such as, for example, 1,2-dichlorobenzene, 1,3-dichlorobenzene, or 1,4-dichlorobenzene, can be particularly desirable, since it can serve to enhance an attractive interaction between the domains 104, 106, 108, 110, and 112 and the nanowires 120, 122, 124, and 126 (or a repulsive interaction between the second region 116 of the organic layer 102 and the nanowires 120, 122, 124, and 126). The concentration of the nanowires 120, 122, 124, and 126 in the composition 118 is typically less than about 1 nM/L or in the range of about 0.0002 mg/ml to about 0.2 mg/ml, such as, for example, in the range of about 0.02 mg/ml to about 0.2 mg/ml. By selecting the concentration of the nanowires 120, 122, 124, and 126 in the composition 118, the number of nanowires deposited on a domain can be controlled. A higher concentration can lead to multiple nanowires deposited on a domain, while a lower concentration can lead to a single nanowire deposited on a domain or bridging two domains.

For certain applications, impurities can be removed from the composition 118 to improve the reliability of the process. Impurities can be removed from the solvent prior to dispersing the nanowires 120, 122, 124, and 126 in the solvent, subsequent to dispersing the nanowires 120, 122, 124, and 126 in the solvent, or both. Typically, impurities will be removed from the solvent prior to contacting the composition 118 with the organic layer 102. For example, the nanowires 120, 122, 124, and 126 can be dispersed in the solvent to form the composition 118, and magnetic impurities in the form of magnetic nanoparticles can be substantially removed from the composition 118 using a magnetic field, such as, for example, using a magnet.

In the illustrated embodiment, the organic layer 102 is contacted with the composition 118 to deposit the nanowires 120, 122, 124, and 126 without requiring use of an external force. In particular, the organic layer 102 can be immersed in the composition 118 in a substantially stationary state and substantially in the absence of an applied electric field. Immersion of the organic layer 102 is typically performed for less than about a minute, such as, for example, about 10 seconds, at a temperature in the range of about 20° C. to about 40° C. Thereafter, the organic layer 102 can be dried while retaining the nanowires 120, 122, 124, and 126 deposited thereon. Drying of the organic layer 102 can be performed by substantially evaporating or otherwise removing the solvent in an inert atmosphere, such as, for example, a nitrogen atmosphere, at a temperature in the range of about 10° C. to about 100° C., such as, for example, in the range of about 20° C. to about 40° C. In some instances, the solvent can be removed in the presence of an electromagnetic field to aid alignment of the nanowires 120, 122, 124, and 126.

In another embodiment, a process includes forming a pair of electrical contacts on a substrate. The pair of electrical contacts are spaced apart from one another. The process also includes depositing a first set of organic molecules on the pair of electrical contacts. The first set of organic molecules have an affinity for nanowires and are electrically conductive. The process also includes depositing a second set of organic molecules on the substrate between the pair of electrical contacts. The second set of organic molecules substantially lack an affinity for the nanowires. The process further includes contacting the pair of electrical contacts including the first set of organic molecules deposited thereon with a composition including the nanowires dispersed in a compatible solvent for a time sufficient so that at least one of the nanowires is deposited to electrically couple the pair of electrical contacts.

Figure 2:
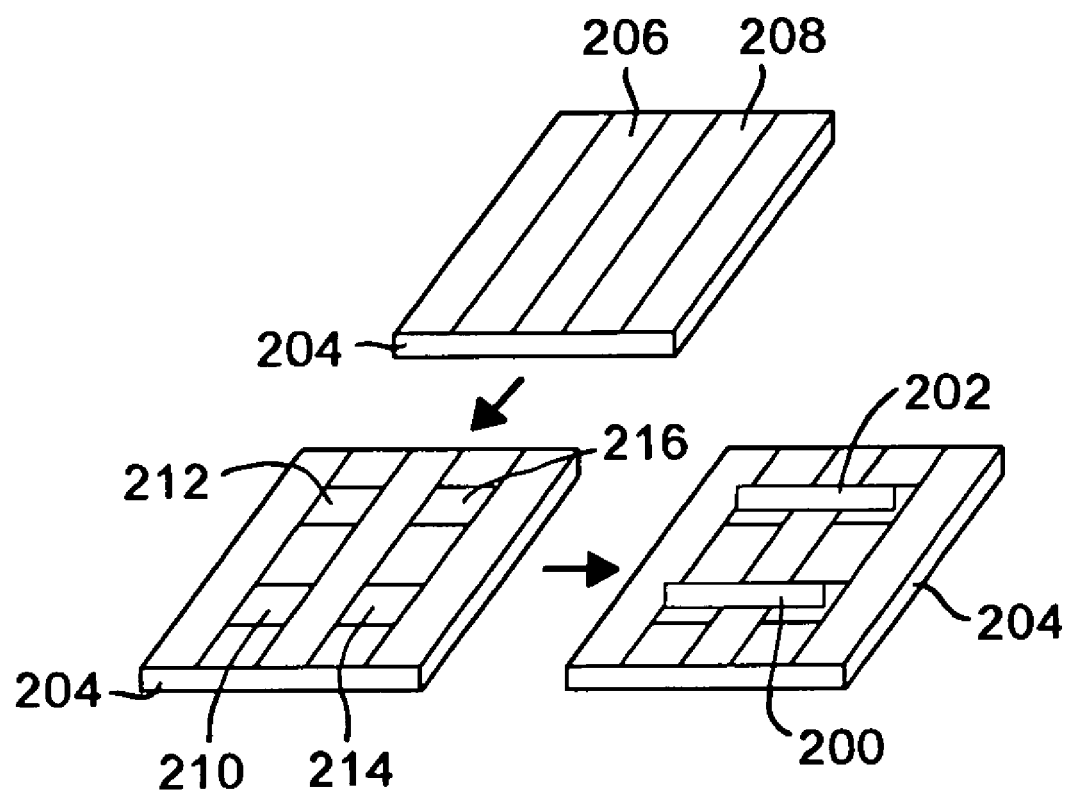
FIG. 2 illustrates a process for depositing nanowires on a substrate, according to an embodiment of the invention.

Attention next turns to FIG. 2, which illustrates a process for depositing nanowires 200 and 202 on a substrate 204, according to such an embodiment of the invention. Initially, a pair of electrical contacts 206 and 208 are formed on the substrate 204. The electrical contacts 206 and 208 can be formed by depositing an electrically conductive material, such as, for example, a metal or a metal oxide, to form a pair of stripes on the substrate 204. Next, a first set of organic molecules are deposited on the electrical contacts 206 and 208 to form domains 210, 212, 214, and 216. Each of the first set of organic molecules can include a polar group having an affinity for the nanowires 200 and 202. Desirably, each of the first set of organic molecules can also include a set of conjugated π-bonds to provide electrical conductivity and to enhance electrical coupling with the nanowires 200 and 202. In the illustrated embodiment, a second set of organic molecules are deposited on remaining areas of the electrical contacts 206 and 208, and each of the second set of organic molecules can include a non-polar group substantially lacking an affinity for the nanowires 200 and 202. The second set of organic molecules can also be deposited on areas of the substrate 204 between the electrical contacts 206 and 208. Alternatively, or in conjunction, a third set of organic molecules can be deposited on these areas of the substrate 204, and each of the third set of organic molecules can include a non-polar group substantially lacking an affinity for the nanowires 200 and 202. Once the organic molecules have been deposited on the substrate 204, the substrate 204 having the organic molecules deposited thereon is contacted with a composition of nanowires for a time sufficient to deposit the nanowires 200 and 202 on the domains 210, 212, 214, and 216. As illustrated in FIG. 2, the nanowire 200 is deposited to bridge the domains 210 and 214 and to electrically couple the electrical contacts 206 and 208. In a similar fashion, the nanowire 204 is deposited to bridge the domains 212 and 216 and to electrically couple the electrical contacts 206 and 208.

Figure 3:
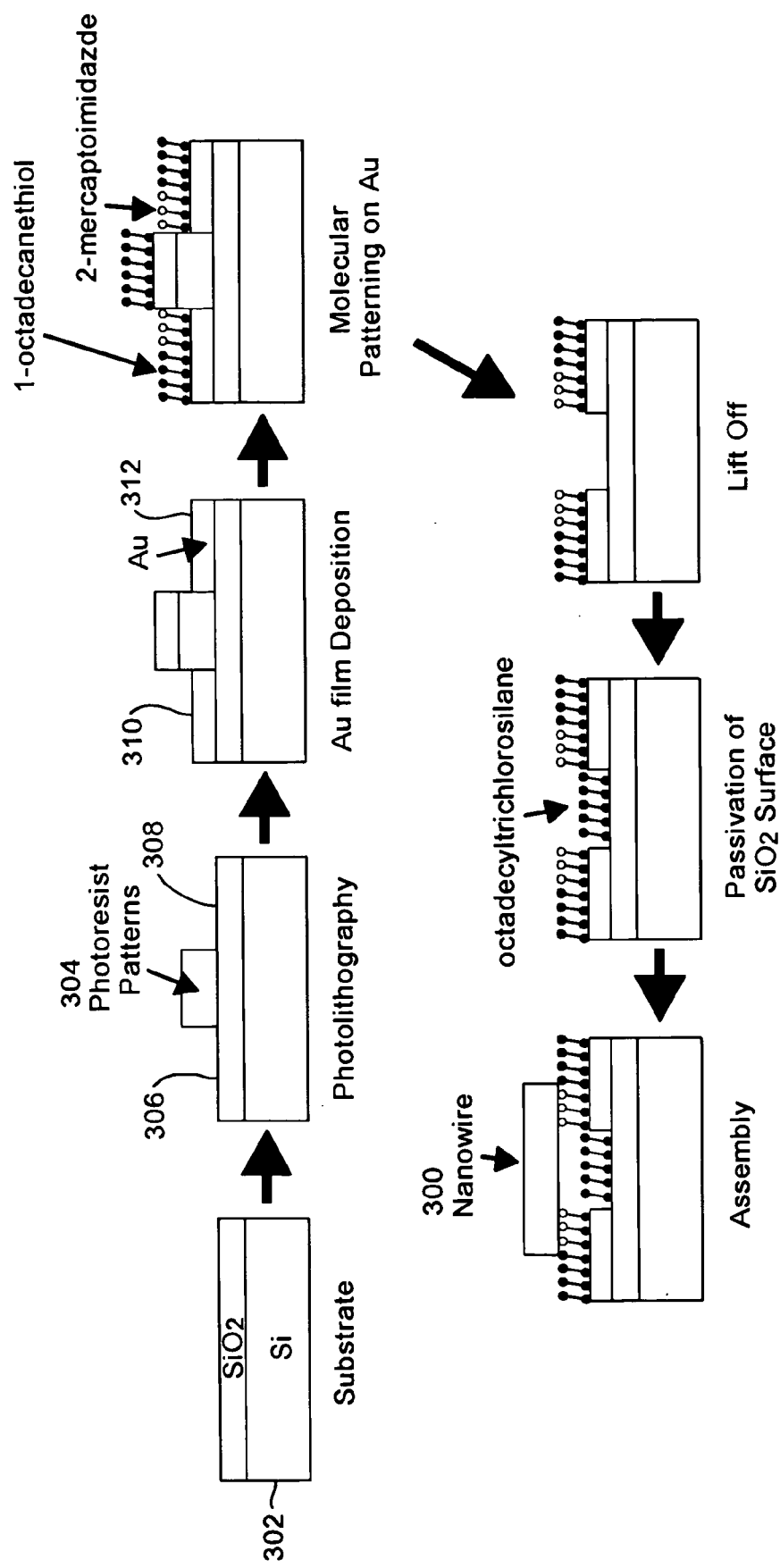
FIG. 3 illustrates a process for depositing a nanowire on a substrate, according to an embodiment of the invention.

FIG. 3 illustrates another process for depositing a nanowire 300 on a substrate 302, according to such an embodiment of the invention. As illustrated in FIG. 3, the substrate 302 is a Si substrate that includes a $SiO_2$ layer formed thereon. Initially, a photoresist layer 304 is formed on the substrate 302, and the photoresist layer 304 is patterned to form a pair of trenches 306 and 308 that expose the $SiO_2$ surface. Next, an electrically conductive material (e.g., gold) is deposited in the trenches 306 and 308 to form a pair of electrical contacts 310 and 312. An organic layer is then formed by depositing a first set of organic molecules (e.g., 2-mercaptoimidazole molecules) on selected areas of the electrical contacts 310 and 312 and then backfilling remaining areas with a second set of organic molecules (e.g., 1-octadecanethiol molecules). The patterned photoresist layer 304 is then removed to expose areas of the $SiO_2$ surface between the electrical contacts 310 and 312 while retaining the first set of organic molecules and the second set of organic molecules deposited on the electrical contacts 310 and 312. A third set of organic molecules (e.g., octadecyltrichlorosilane molecules) are then deposited on the exposed areas of the $SiO_2$ surface. Once the organic molecules have been deposited on the substrate 302, the substrate 302 having the organic molecules deposited thereon is contacted with a composition of nanowires for a time sufficient to deposit the nanowire 300 to electrically couple the electrical contacts 310 and 312.

It should be recognized that the embodiments of the invention discussed above are provided by way of example, and various other aspects and embodiments of the invention are contemplated. For example, in a further embodiment, a process includes depositing a first set of organic molecules on a substrate to form a set of domains that are spaced apart from one another. Each of the first set of organic molecules includes a set of conjugated π-bonds and an exposed polar group. The process also includes providing a compositing including nanowires dispersed in a compatible solvent and contacting the substrate including the first set of organic molecules deposited thereon with the composition for a time sufficient so that each of the set of domains includes at least one of the nanowires deposited thereon.

In yet a further embodiment, a process includes depositing a set of organic molecules on an area of the substrate. This area of the substrate is selected, so that nanowires are deposited on a remaining area of the substrate. Each of the set of organic molecules includes an exposed non-polar group. The non-polar groups of the set of organic molecules substantially lack an affinity for the nanowires and facilitate deposition of the nanowires on the remaining area of the substrate by substantially blocking deposition of the nanowires on the area of the substrate having the set of organic molecules deposited thereon. Advantageously, the nanowires are deposited on the remaining area of the substrate without requiring deposition of organic molecules on the remaining area of the substrate. The remaining area of the substrate can include an electrically conductive layer formed thereon, and a nanowire can be directly deposited on the electrically conductive layer to enhance electrical coupling between the nanowire and the electrically conductive layer. In some instances, the remaining area of the substrate can have an affinity for the nanowires and can facilitate deposition of the nanowires by attracting the nanowires towards the remaining area of the substrate. For example, the substrate can be a $SiO_2$ substrate, and the remaining area of the substrate can be electrically charged and can have an electrostatic affinity for the nanowires. The positions and orientations of the nanowires deposited on the substrate can be controlled by selecting the shape and size of the area of the substrate having the set of organic molecules deposited thereon. For example, the set of organic molecules can be deposited so that the remaining area of the substrate is elongated, and the nanowires can be deposited on the remaining area of the substrate to be substantially aligned therewith. The process also includes providing a composition including the nanowires dispersed in a halogenated organic solvent and contacting the substrate including the set of organic molecules deposited thereon with the composition for a time sufficient to selectively deposit at least one of the nanowires on the remaining area of the substrate.

Another aspect of the invention relates to nanowire-based devices that are formed using the processes described herein. The nanowire-based devices are useful in a number of applications. For example, the nanowire-based devices can be incorporated in electronic circuitry for various electronic devices, such as, for example, computers, television sets, and mobile phones.

In one embodiment, a nanowire-based device includes an electrically conductive layer and an organic layer positioned on the electrically conductive layer. The organic layer is formed of a set of organic molecules each including a set of conjugated π-bonds. The nanowire-based device also includes a nanowire positioned on the organic layer.

In another embodiment, a nanowire-based device includes a substrate and a pair of electrical contacts formed on the substrate. The pair of electrical contacts are spaced apart from one another. The nanowire-based device also includes a first set of organic molecules deposited on the pair of electrical contacts. The first set of organic molecules are electrically conductive and each includes a polar group. The nanowire-based device further includes a first nanowire deposited on the first set of organic molecules to electrically couple the pair of electrical contacts.

EXAMPLES

The following examples are provided as a guide for a practitioner of ordinary skill in the art. The examples should not be construed as limiting the invention, as the examples merely provide specific methodology useful in understanding and practicing some embodiments of the invention.

Example 1

An electrically conductive layer was formed on a $SiO_2$ substrate by thermally depositing a 2 nm thick titanium layer followed by a 8 nm thick gold layer under a high vacuum condition (pressure $\sim 2\times 10^{-7}$ torr). An organic layer was then formed by depositing a first type of organic molecule on the electrically conductive layer via dip-pen nanolithography or microcontact printing and then backfilling remaining areas with a second type of organic molecule. The backfilling operation was performed by immersing the substrate having the first type of organic molecule deposited thereon in a solution of the second type of organic molecule (~3 mM in ethanol) for about 2 minutes. Highest grade organic molecules and solvents were obtained from Sigma-Aldrich Co. and Fisher Scientific International Inc., respectively. A conductive probe atomic force microscope (Digital Instruments) equipped with a temperature controller, a humidity controller, a closed-loop scanner, and a dip-pen nanolithography software (Nanoink, Inc.) was used for topography imaging and dip-pen nanolithography writing. Lateral force microscopy was also used to characterize the resulting organic layer.

Next, purified SWCNTs (Carbon Nanotechnologies, Inc.) were dispersed in 1,2-dichlorobenzene and sonicated for about 20 minutes to form a composition. Two typical concentrations of the SWCNTs in the composition were 0.2 mg/ml and 0.02 mg/ml. To remove magnetic catalysis nanoparticle impurities from the composition, a small magnet (Digital Instruments) was placed near the composition, and a purified part of the composition was extracted. For depositing SWCNTs, the substrate having the organic layer formed thereon was placed in the composition for about 10 seconds and was then rinsed thoroughly with clean 1,2-dichlorobenzene.

Example 2

Figure 4:
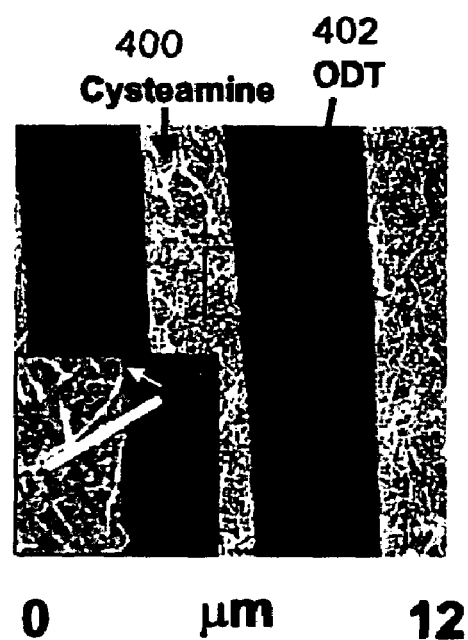
FIG. 4 illustrates a topography image of single-wall carbon nanotubes ("SWCNTs") deposited on an organic layer using the process described in Example 1.

FIG. 4 illustrates a topography image of SWCNTs deposited on an organic layer using the process described in Example 1. The SWCNTs were deposited by contacting the organic layer with a composition having a concentration of the SWCNTs of about 0.2 mg/ml. Here, the organic layer included a first region 400 formed from cysteamine molecules having polar amino groups and a second region 402 formed from 1-octadecanethiol ("ODT") molecules having non-polar methyl groups. FIG. 4 illustrates that the SWCNTs were deposited on the first region 400 and the second region 402 of the organic layer with different number densities. In particular, the polar amino groups attracted the SWCNTs towards the first region 400 of the organic layer, while the non-polar methyl groups substantially blocked deposition of the SWCNTs on the second region 402 of the organic layer. As illustrated in the inset, SWCNTs deposited near the boundary between the first region 400 and the second region 402 of the organic layer exhibited a substantially sharp edge definition, and the SWCNTs typically did not cross the boundary. In particular, as illustrated with the tangent bar in the inset, some SWCNTs bend to remain inside the first region 400 of the organic layer. Presumably, a SWCNT may be initially deposited across the boundary, and a portion of the SWCNT in the second region 402 of the organic layer may be attracted towards the first region 400 of the organic layer, thus leading to the observed bending of the SWCNT. Similar results were observed at boundaries between regions formed from ODT and regions formed from various other types of organic molecules having polar groups, including 16-mercaptohexadecanoic acid (carboxyl group), 2-mercaptoimidazole (nitrogen atom in aromatic ring), 4-mercaptopyridine (nitrogen atom in aromatic ring), 2-mercaptopyrimidine (nitrogen atom in aromatic ring), and 6-mercapto-1-hexanol (hydroxyl group).

Example 3

Figure 5:
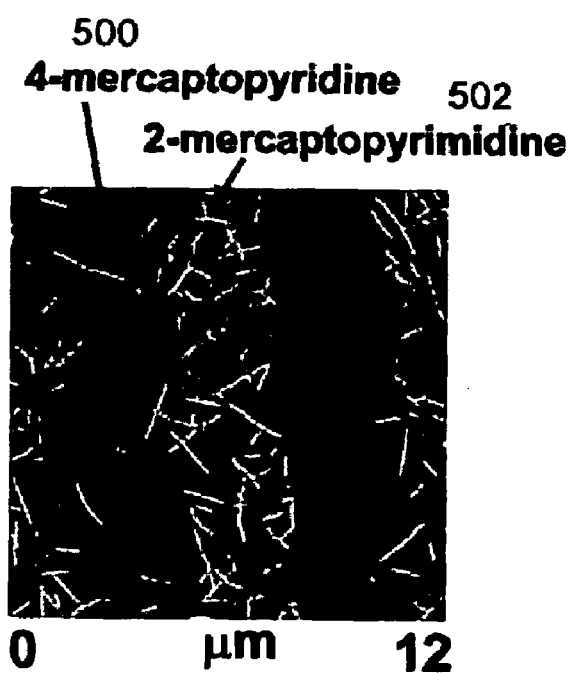
FIG. 5 illustrates another topography image of SWCNTs deposited on an organic layer using the process described in Example 1.

FIG. 5 illustrates another topography image of SWCNTs deposited on an organic layer using the process described in Example 1. Here, the organic layer included a first region 500 formed from 4-mercaptopyridine molecules having polar groups (nitrogen atoms in aromatic rings) and a second region 502 formed from 2-mercaptopyrimidine molecules also having polar groups (nitrogen atoms in aromatic rings). In contrast to FIG. 4, FIG. 5 illustrates that the SWCNTs were deposited on both the first region 500 and the second region 502 of the organic layer, although with somewhat different number densities. In addition, various SWCNTs deposited near the boundary between the first region 500 and the second region 502 of the organic layer were observed to cross the boundary.

Example 4

Figure 6:
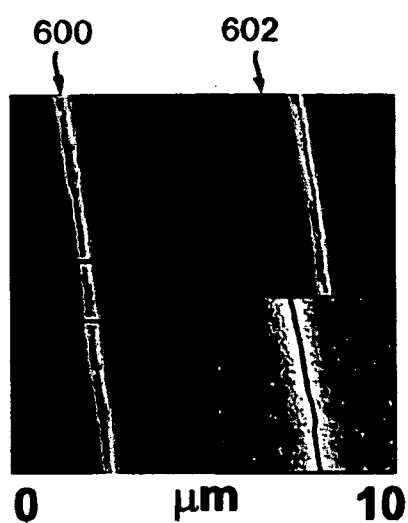
FIG. 6 illustrates a lateral force microscopy image of SWCNTs deposited on an organic layer using the process described in Example 1.

FIG. 6 illustrates a lateral force microscopy image of SWCNTs deposited on an organic layer using the process described in Example 1. The SWCNTs were deposited by contacting the organic layer with a composition having a concentration of the SWCNTs of about 0.2 mg/ml. Here, the organic layer included a first region 600 formed from cystearnine molecules in a line pattern and a second region 602 formed from ODT molecules. The hydrophobic surfaces of the SWCNTs appear as dark lines, while the hydrophilic cysteamine molecules appear as bright areas. FIG. 6 illustrates that the SWCNTs were selectively deposited on the first region 600 of the organic layer. In addition, as illustrated in the inset, the SWCNTs were deposited to be substantially aligned with the first region 600 of the organic layer. Advantageously, such alignment of the SWCNTs was achieved without requiring use of an external force.

Example 5

Figure 7:
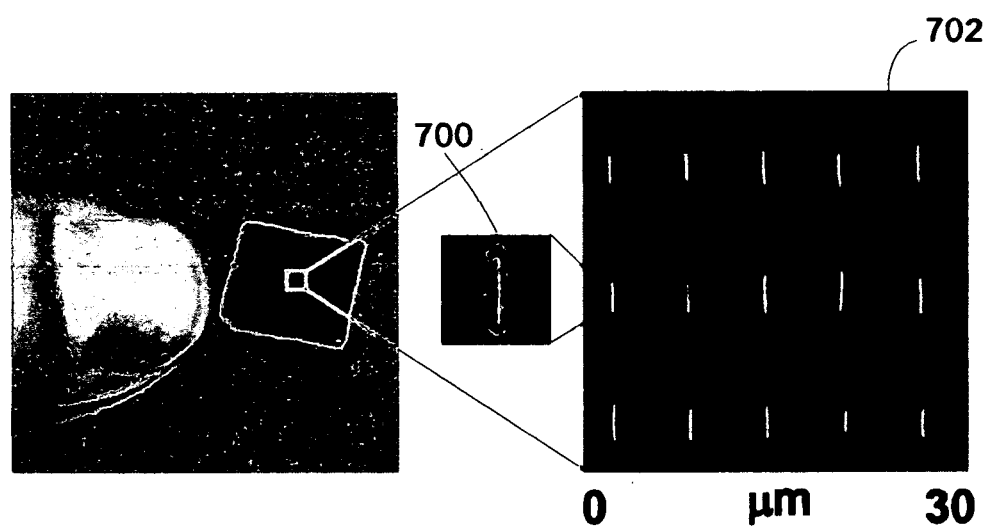
FIG. 7 illustrates a further topography image of SWCNTs deposited on an organic layer using the process described in Example 1.

FIG. 7 illustrates a further topography image of SWCNTs deposited on an organic layer using the process described in Example 1. The SWCNTs were deposited by contacting the organic layer with a composition having a concentration of the SWCNTs of about 0.02 mg/ml. Here, the organic layer included a first region that included a number of spaced-apart domains (e.g., domain 700) formed from 2-mercaptoimidazole ("2-MI") molecules having polar groups (nitrogen atoms in aromatic rings) and a second region 702 formed from ODT molecules. The organic layer was formed in a few minutes via microcontact printing. The domains were elongated and were surrounded by the second region 702 of the organic layer. FIG. 7 illustrates that the SWCNTs were selectively deposited on the domains to be substantially aligned therewith. Advantageously, such alignment of the SWCNTs was achieved without requiring use of an external force. Moreover, by using the composition having the relatively low concentration of the SWCNTs, a single SWCNT was typically deposited on an individual domain. Numerous SWCNTs were successfully deposited on the domains with a yield of about 90% or better and with a high level of precision.

Example 6

Figure 8:
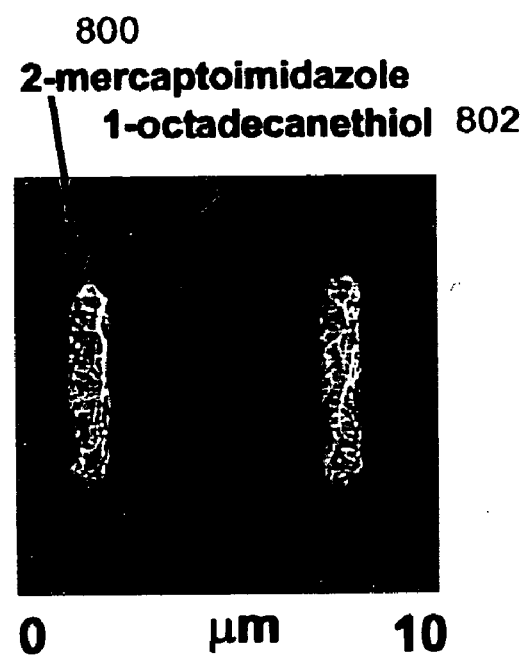
FIG. 8 illustrates a yet further topography image of SWCNTs deposited on an organic layer using the process described in Example 1.

FIG. 8 illustrates a yet further topography image of SWCNTs deposited on an organic layer using the process described in Example 1. The SWCNTs were deposited by contacting the organic layer with a composition having a concentration of the SWCNTs of about 0.2 mg/ml. Here, the organic layer included a first region that included a number of domains (e.g., domain 800) formed from 2-MI molecules and a second region 802 formed from ODT molecules. The domains were elongated and were surrounded by the second region 802 of the organic layer. FIG. 8 illustrates that the SWCNTs were selectively deposited on the domains. By using the composition having the relatively high concentration of the SWCNTs, multiple SWCNTs were typically deposited on an individual domain.

Example 7

A photoresist layer was formed on a $SiO_2$ substrate, and the photoresist layer was patterned to form trenches. Electrical contacts were formed by thermally depositing a 2 nm thick titanium layer followed by a 8 nm thick gold layer under a high vacuum condition (pressure $\sim 2 \times 10^{-7}$ torr). An organic layer was then formed by depositing a first type of organic molecule via dip-pen nanolithography or microcontact printing and then backfilling remaining areas with a second type of organic molecule. The backfilling operation was performed by immersing the substrate having the first type of organic molecule deposited thereon in a solution of the second type of organic molecule (~3 mM in ethanol) for about 2 minutes. To passivate the $SiO_2$ surface, the patterned photoresist layer was removed to expose areas of the $SiO_2$ surface between the electrical contacts, and the substrate having the first type of organic molecule and the second type of organic molecule deposited thereon was placed in a solution of a third type of organic molecule (1:1000 by volume in anhydrous hexane) for about 3 minutes. Highest grade organic molecules and solvents were obtained from Sigma-Aldrich Co. and Fisher Scientific International Inc., respectively. A conductive probe atomic force microscope (Digital Instruments) equipped with a temperature controller, a humidity controller, a closed-loop scanner, and a dip-pen nanolithography software (Nanoink, Inc.) was used for topography imaging and dip-pen nanolithography writing. Lateral force microscopy was also used to characterize the resulting organic layer.

Next, purified SWCNTs (Carbon Nanotechnologies, Inc.) were dispersed in 1,2-dichlorobenzene and sonicated for about 20 minutes to form a composition. Two typical concentrations of the SWCNTs in the composition were 0.2 mg/ml and 0.02 mg/ml. To remove magnetic catalysis nanoparticle impurities from the composition, a small magnet (Digital Instruments) was placed near the composition, and a purified part of the composition was extracted. For depositing SWCNTs, the substrate having the organic layer formed thereon was placed in the composition for about 10 seconds and was then rinsed thoroughly with clean 1,2-dichlorobenzene.

Example 8

Figure 9:
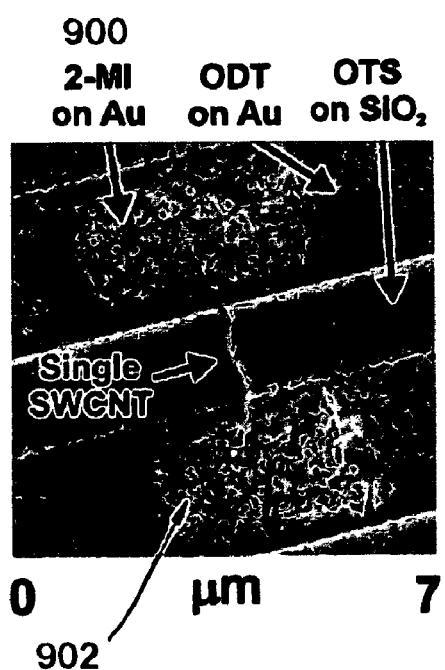
FIG. 9 illustrates a lateral force microscopy image of a SWCNT deposited to electrically couple a pair of electrical contacts using the process described in Example 7.

FIG. 9 illustrates a lateral force microscopy image of a SWCNT deposited to electrically couple a pair of electrical contacts using the process described in Example 7. The SWCNT was deposited by contacting the electrical contacts with a composition having a concentration of SWCNTs of about 0.02 mg/ml. Here, the electrical contacts included 2-MI molecules deposited thereon to form a pair of domains 900 and 902. The domains 900 and 902 served to attract the SWCNT from the composition and were sized so that the SWCNT was deposited to bridge the domains 900 and 902. Remaining areas of the electrical contacts included ODT molecules deposited thereon, while areas of the $SiO_2$ surface between the electrical contacts included octadecyltrichlorosilane ("OTS") molecules deposited thereon, which OTS molecules have non-polar methyl groups. To reduce or prevent undesirable chemical doping, a portion of the SWCNT between the electrical contacts, which can determine junction characteristics, was not in direct contact with any polar or non-polar groups. Although 2-MI molecules mediated the junction between the SWCNT and the electrical contacts, conducting atomic force microscopy analysis confirmed that the SWCNT exhibited decent electrical coupling with the electrical contacts. This electrical coupling was achieved presumably due to the short length (i.e., about 1 nanometer) and conjugated π-bonds of the 2-MI molecules.

Example 9

Figure 10:
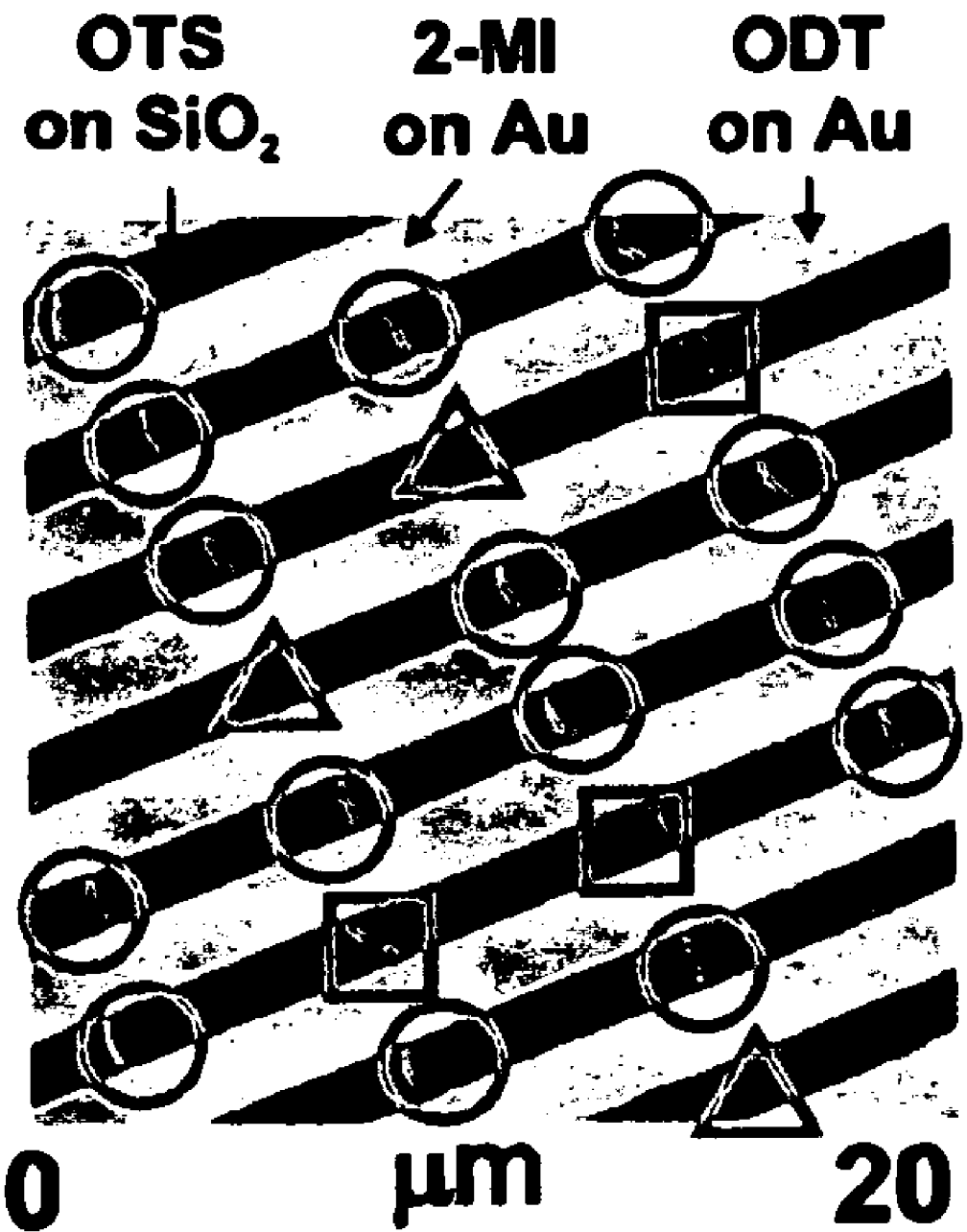
FIG. 10 illustrates a topography image of SWCNTs deposited to electrically couple electrical contacts using the process described in Example 7.

FIG. 10 illustrates a topography image of SWCNTs deposited to electrically couple electrical contacts using the process described in Example 7. Here, domains were formed from 2-MI molecules via microcontact printing on long gold stripes that served as the electrical contacts. Remaining areas of the gold stripes included ODT molecules deposited thereon, while areas of the $SiO_2$ surface between the gold stripes included OTS molecules deposited thereon. Numerous SWCNTs were successfully deposited on a sample area of about 1 $cm^2$. As illustrated in FIG. 10, junctions including 0, 1, and 2 SWCNTs are marked by triangles, circles, and squares, respectively. Approximately 70 percent of the junctions included a single SWCNT. It was observed that this percentage can depend on the spacing between the gold stripes and the uniformity of lengths of the SWCNTs.

Example 10

Figure 11:
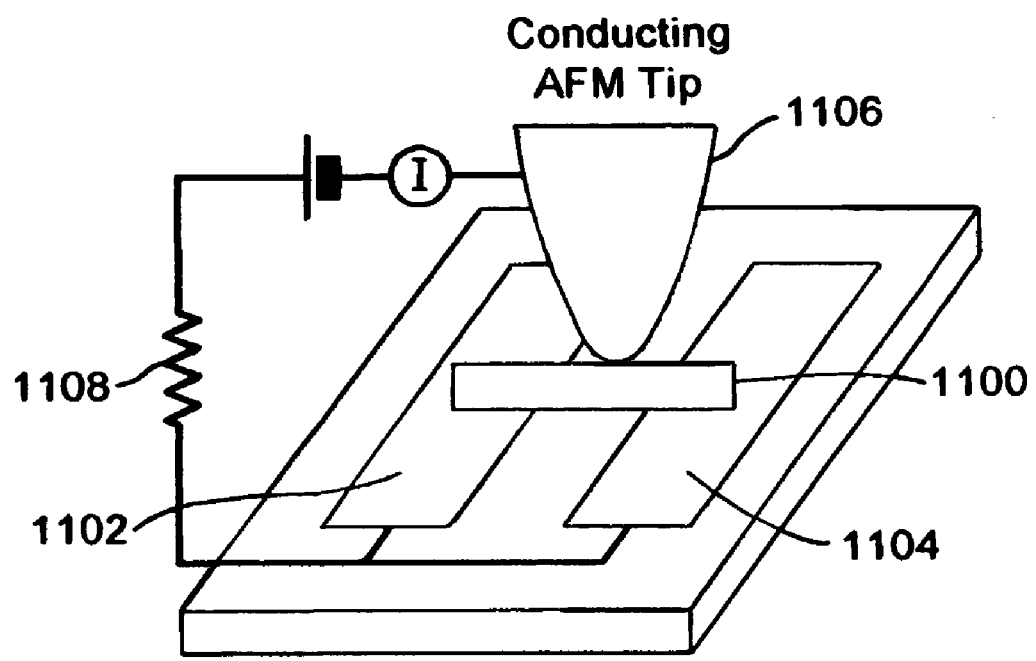
FIG. 11 illustrates a schematic diagram (top) of a conducting atomic force microscopy experiment and a resulting image (bottom) of a SWCNT deposited to electrically couple a pair of electrical contacts using the process described in Example 7.
Figure 11:
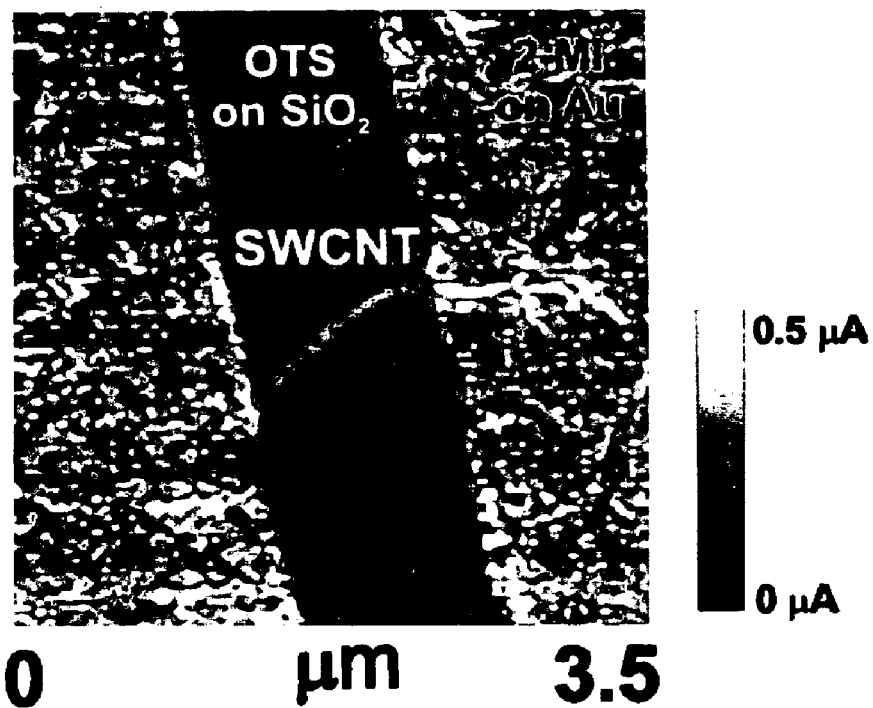

FIG. 11 illustrates a schematic diagram (top) of a conducting atomic force microscopy experiment and a resulting image (bottom) of a SWCNT 1100 deposited to electrically couple a pair of electrical contacts 1102 and 1104. Here, domains were formed on the electrical contacts 1102 and 1104 from 2-MI molecules, and areas of the $SiO_2$ surface between the electrical contacts included OTS molecules deposited thereon. To form the image, a conducting atomic force microscopy tip 1106 (doped-diamond coated Si tip, Digital Instruments) made a direct contact with the sample surface, and current was measured with a sample bias of about 0.8 V. A 100 kΩ resistor 1108 was electrically coupled in series to avoid a short circuit. The current measured for the SWCNT 1100 indicated a decent electrical coupling between the SWCNT 1100 and the electrical contacts 1102 and 1104.

Each of the patent applications, patents, publications, and other published documents mentioned or referred to in this specification is herein incorporated by reference in its entirety, to the same extent as if each individual patent application, patent, publication, and other published document was specifically and individually indicated to be incorporated by reference.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, process, process operation or operations, to the objective, spirit and scope of the invention. All such modifications are intended to be within the scope of the claims appended hereto. In particular, while the processes disclosed herein have been described with reference to particular operations performed in a particular order, it will be understood that these operations may be combined, sub-divided, or re-ordered to form an equivalent process without departing from the teachings of the invention. Accordingly, unless specifically indicated herein, the order and grouping of the operations are not limitations of the invention.

Appendix A

This appendix provides examples of organic molecules that can be used to form an organic layer, according to some embodiments of the invention.

On gold surface: $R_1SH$, $R_1SSR_2$, $R_1SR_2$, $R_1SO_2H$, $(R_1)_3P$, $R_1NC$, $R_1CN$, $(R_1)_3N$, and ArSH, wherein:
1) $R_1$ and $R_2$ have the formula $X(CH_2)_{n1}$ and $X(CH_2)_{n2}$, respectively;
2) n1 and n2 are integers in the range of 0 to 30 and can be the same or different;
3) Ar is an aryl group;
4) X is:
   a group having an affinity for nanowires: —COOH, —$(CH_2)_{m1}CO_2(CH_2)_{m2}CH_3$, —$(CH_2)_{m1}OH$, —$CH_2OH$, a monovalent form of ethylene glycol, a monovalent form of hexa(ethylene glycol), —$O(CH_2)_{m1}CH_3$, —$NH_2$, —$NH(CH_2)_{m1}NH_2$, a halo group, a monovalent form of glucose, a monovalent form of maltose, a monovalent form of a nucleic acid, or a monovalent form of a protein; or
   a group substantially lacking an affinity for nanowires: —$CH_3$, —CH=$CH_2$, or a monovalent form of fullerene or $C_{60}$; and
5) m1 and m2 are integers in the range of 0 to 30 and can be the same or different.

Examples of $R_1SH$ and ArSH: propanedithiol, hexanedithiol, octanedithiol, n-hexadecanethiol, n-octadecanethiol, n-docosanethiol, 11-mercapto-1-undecanol, 16-mercapto-1-hexadecanoic acid, α,α'-p-xylyldithiol, 4,4'-biphenyldithiol, terphenyldithiol, and DNA-alkanethiol.

On aluminum, gallium arsenide or titanium dioxide surface: $R_1SH$, wherein:
1) $R_1$ has the formula $X(CH_2)_n$;
2) n is an integer in the range of 0 to 30;

3) X is:
   a group having an affinity for nanowires: —COOH, —(CH$_2$)$_{m1}$CO$_2$(CH$_2$)$_{m2}$CH$_3$, —(CH$_2$)$_{m1}$OH, —CH$_2$OH, a monovalent form of ethylene glycol, a monovalent form of hexa(ethylene glycol), —O(CH$_2$)$_{m1}$CH$_3$, —NH$_2$, —NH(CH$_2$)$_{m1}$NH$_2$, a halo group, a monovalent form of glucose, a monovalent form of maltose, a monovalent form of a nucleic acid, or a monovalent form of a protein; or
   a group substantially lacking an affinity for nanowires: —CH$_3$, —CH=CH$_2$, or a monovalent form of fullerene or C$_{60}$; and
4) m1 and m2 are integers in the range of 0 to 30 and can be the same or different.

Examples of R$_1$SH: 2-mercaptoacetic acid and n-octadecanethiol.

On silicon dioxide surface: R$_1$SH and R$_1$SiCl$_3$, wherein:
1) R$_1$ has the formula X(CH$_2$)$_n$;
2) n is an integer in the range of 0 to 30;
3) X is:
   a group having an affinity for nanowires: —COOH, —(CH$_2$)$_{m1}$CO$_2$(CH$_2$)$_{m2}$CH$_3$, —(CH$_2$)$_{m1}$OH, —CH$_2$OH, a monovalent form of ethylene glycol, a monovalent form of hexa(ethylene glycol), —O(CH$_2$)$_{m1}$CH$_3$, —NH$_2$, —NH(CH$_2$)$_{m1}$NH$_2$, a halo group, a monovalent form of glucose, a monovalent form of maltose, a monovalent form of a nucleic acid, or a monovalent form of a protein; or
   a group substantially lacking an affinity for nanowires: —CH$_3$, —CH=CH$_2$, or a monovalent form of fullerene or C$_{60}$; and
4) m1 and m2 are integers in the range of 0 to 30 and can be the same or different.

Examples of R$_1$SH and R$_1$SiCl$_3$: 16-mercapto-1-hexadecanoic acid, octadecyltrichlorosilane, and 3-(2-aminoethylamino)propyltrimethoxysilane.

Appendix B

Table 2 of this appendix provides additional examples of organic molecules that can be used to form an organic layer, according to some embodiments of the invention.

TABLE 2

| Organic Molecule | Surface | Coupling to Surface | Organic molecules having affinity for nanowires | Organic molecules substantially lacking affinity for nanowires |
|---|---|---|---|---|
| RSH<br>ArSH | Au<br><br>Ag<br><br>Cu<br><br><br>GaAs<br><br>InP | RS—Au<br>ArS—Au<br>RS—Ag<br>ArS—Ag<br>RS—Cu<br>ArS—Cu<br><br>RS—GaAs<br>ArS—GaAs<br>RS—InP<br>ArS—InP | 4-PySH<br>HOOC(CH$_2$)$_{15}$SH<br>propanedithiol<br>hexanedithiol<br>octanedithiol<br>α,α'-p-xylyldithiol<br>11-mercapto-1-undecanol<br>4,4'-biphenyldithiol<br>protein-terphenyldithiol<br>DNA-alkanethiol<br>2-mercaptoacetic acid | C$_{12}$H$_{25}$SH<br>C$_6$H$_5$SH<br>n-hexadecanethiol<br>n-octadecanethiol<br>n-docosanethiol<br>C$_{10}$H$_{21}$SH<br>C$_8$H$_{17}$SH<br>C$_6$H$_{13}$SH |
| RSSR'<br>(disulfides) | Au | RS—Au | (4-PyS)$_2$ | (C$_{22}$H$_{45}$)$_2$S$_2$<br>(C$_{19}$H$_{39}$)$_2$S$_2$<br>[CH$_3$(CH$_2$)$_{15}$S]$_2$ |
| RSR'<br>(sulfides) | Au | RS—Au | CH$_3$(CH$_2$)$_{11}$S(CH$_2$)$_{10}$CO$_2$H | [CH$_3$(CH$_2$)$_9$]$_2$S |
| RSO$_2$H | Au | RSO$_2$—Au | | C$_6$H$_5$—SO$_2$H |
| R$_3$P | Au | R$_3$P—Au | | (C$_6$H$_{11}$)$_3$P |
| RNC | Pt | RNC—Pt | | (C$_5$H$_6$)Fe(C$_5$H$_5$)—(CH$_2$)$_{12}$—NC |
| RSiCl$_3$<br>RSi(OR')$_3$ | SiO$_2$<br>glass | siloxane | 16-mercapto-1-hexadecanoic acid<br>3-(2-aminoethylamino)propyl trimethoxysilane | C$_{10}$H$_{21}$SiCl$_3$,<br>C$_{12}$H$_{25}$SiCl$_3$<br>C$_{16}$H$_{33}$SiCl$_3$<br>C$_{12}$H$_{25}$SiCl$_3$<br>CH$_2$=CHCH$_2$SiCl$_3$<br>octadecyltrichlorosilane |
| (RCOO)$_2$<br>(neat)<br>RCH=CH$_2$ | Si<br>Si—H<br>Si<br>Si—H | Si—CH$_2$—<br>Si—O(CO)CH$_2$<br>R(CH$_2$)$_2$Si | | [CH$_3$(CH$_2$)$_{10}$COO]$_2$<br>[CH$_3$(CH$_2$)$_{16}$COO]$_2$<br>CH$_3$(CH$_2$)$_{15}$CH=CH$_2$<br>CH$_3$(CH$_2$)$_8$CH=CH$_2$ |
| RLi, RMgX | Si<br>Si—Cl | R—Si | | C$_4$H$_9$Li<br>C$_{18}$H$_{37}$Li<br>C$_4$H$_9$MgX<br>C$_{12}$H$_{25}$MgX<br>X = Br or Cl |
| RCOOH | Metal oxides | RCOO$^-$ ... MO$_n$ | CH$_3$(CH$_2$)$_m$OC$_{10}$H$_6$COOH<br>m = 9, 15–19 | C$_{15}$H$_{31}$COOH<br>H$_2$C=CH(CH$_2$)$_{19}$COOH |
| RCONHOH | Metal oxides | RCONHOH ... MO$_n$ | CH$_3$(CH$_2$)$_{16}$CONHOH<br>HO(CH$_2$)$_{15}$CONHOH | |
| RPO$_3$H$_2$ | ZrO$_2$ | RPO$_3^{2-}$ ... Zr$^{IV}$ | Zr(O$_3$PCH$_2$CH$_2$COOH)$_2$ | |
| RPO$_3$H$_2$ | In$_2$O$_3$/SnO$_2$ (ITO) | RPO$_3^{2-}$ ... M$^{n+}$ | | (C$_5$H$_6$)Fe(C$_5$H$_5$)—<br>—(CH$_2$)$_6$—PO$_3$H$_2$ |

What is claimed is:

1. A nanowire-based device, which comprises:
an electrically conductive layer;
an organic layer positioned on the electrically conductive layer, the organic layer being elongated and being formed of a plurality of organic molecules each including a plurality of conjugated π-bonds; and
a nanowire positioned on the organic layer to be aligned with the organic layer.

2. The nanowire-based device of claim 1, wherein the electrically conductive layer includes a metal.

3. The nanowire-based device of claim 2, wherein the metal is gold.

4. The nanowire-based device of claim 1, wherein each of the plurality of organic molecules further includes an anchoring group having an affinity for the electrically conductive layer and a polar group having an affinity for the nanowire.

5. The nanowire-based device of claim 4, wherein the polar group is electrically charged.

6. The nanowire-based device of claim 4, wherein the polar group includes at least one of a nitrogen atom and an oxygen atom.

7. The nanowire-based device of claim 4, wherein at least one of the plurality of organic molecules is a substituted heteroarene.

8. The nanowire-based device of claim 7, wherein the substituted heteroarene is selected from the group consisting of 4-mercaptopyridine, 2-mercaptoimidazole, and 2-mercaptopyrimidine.

9. A nanowire-based device, which comprises:
a substrate;
a pair of electrical contacts formed on the substrate, the pair of electrical contacts being spaced apart from one another;
a first plurality of organic molecules deposited on the pair of electrical contacts, the first plurality of organic molecules being electrically conductive and each including a polar group;
a second plurality of organic molecules deposited on the substrate between the pair of electrical contacts, the second plurality of organic molecules each including a non-polar group; and
a first nanowire deposited on the first plurality of organic molecules to electrically couple the pair of electrical contacts.

10. The nanowire-based device of claim 9, wherein the pair of electrical contacts includes at least one of a metal and a metal oxide.

11. The nanowire-based device of claim 9, wherein the polar group has an electrostatic affinity for the first nanowire.

12. The nanowire-based device of claim 9, wherein each of the first plurality of organic molecules further includes a plurality of conjugated π-bonds.

13. The nanowire-based device of claim 9, wherein the non-polar group substantially lacks an electrostatic affinity for the first nanowire.

14. The nanowire-based device of claim 9, wherein the first plurality of organic molecules are deposited to form a first domain and a second domain, such that the first domain is positioned on a first one of the pair of electrical contacts, and the second domain is positioned on a second one of the pair of electrical contacts, and wherein the first nanowire is deposited to bridge the first domain and the second domain.

15. The nanowire-based device of claim 14, wherein the first plurality of organic molecules are further deposited to form a third domain and a fourth domain, such that the third domain is positioned on the first one of the pair of electrical contacts, and the fourth domain is positioned on the second one of the pair of electrical contacts, and wherein the nanowire-based device further comprises:
a second nanowire deposited to bridge the third domain and the fourth domain.

* * * * *